United States Patent
Sheelavant et al.

(10) Patent No.: US 10,403,521 B2
(45) Date of Patent: Sep. 3, 2019

(54) MODULAR SUBSTRATE HEATER FOR EFFICIENT THERMAL CYCLING

(71) Applicant: Applied Materials, Inc., Santa Clara, CA (US)

(72) Inventors: Gangadhar Sheelavant, Karnataka (IN); Cariappa Achappa Baduvamanda, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 1213 days.

(21) Appl. No.: 14/172,754

(22) Filed: Feb. 4, 2014

(65) Prior Publication Data

US 2014/0263271 A1 Sep. 18, 2014

Related U.S. Application Data

(60) Provisional application No. 61/780,090, filed on Mar. 13, 2013.

(51) Int. Cl.
*H01L 21/67* (2006.01)

(52) U.S. Cl.
CPC .............. *H01L 21/67115* (2013.01)

(58) Field of Classification Search
CPC .................. E04G 15/02; H01L 21/67115
USPC ..... 219/443.1, 411, 392, 497; 392/418, 413; 118/728, 729
See application file for complete search history.

(56) References Cited

U.S. PATENT DOCUMENTS

| | | | | |
|---|---|---|---|---|
| 5,525,160 A | * | 6/1996 | Tanaka | C23C 16/4401 118/500 |
| 6,108,490 A | * | 8/2000 | Lee | C23C 16/481 118/724 |
| 6,121,579 A | * | 9/2000 | Aoki | C23C 16/481 118/730 |
| 6,156,079 A | | 12/2000 | Ho et al. | |
| 6,280,183 B1 | | 8/2001 | Mayur et al. | |
| 6,464,825 B1 | * | 10/2002 | Shinozaki | C23C 16/4584 118/724 |
| 6,770,851 B2 | | 8/2004 | Granneman et al. | |
| 6,942,753 B2 | * | 9/2005 | Choi | C23C 16/45565 118/715 |
| 7,378,618 B1 | | 5/2008 | Sorabji et al. | |
| 7,976,634 B2 | | 7/2011 | Carlson et al. | |

(Continued)

FOREIGN PATENT DOCUMENTS

| | | |
|---|---|---|
| CN | 101207010 A | 6/2008 |
| JP | H06151413 A | 5/1994 |

(Continued)

OTHER PUBLICATIONS

Chinese Search Report for Application No. 201480013023.4 dated Mar. 21, 2017.

(Continued)

*Primary Examiner* — Tu B Hoang
*Assistant Examiner* — Diallo I Duniver
(74) *Attorney, Agent, or Firm* — Patterson + Sheridan LLP

(57) ABSTRACT

A substrate heater for a substrate processing chamber which includes a substrate support for a substrate processing chamber which includes a body having a top plate with a substrate receiving surface, and a movable heater disposed in the body, the heater being movable relative to the top plate.

18 Claims, 4 Drawing Sheets

(56) References Cited

U.S. PATENT DOCUMENTS

| | | | |
|---|---|---|---|
| 2001/0017294 A1* | 8/2001 | Aoki | H01L 21/02238 219/390 |
| 2002/0096196 A1* | 7/2002 | Toshima | B08B 3/04 134/21 |
| 2004/0060917 A1 | 4/2004 | Liu et al. | |
| 2004/0129211 A1* | 7/2004 | Blonigan | C23C 16/455 118/715 |
| 2006/0065197 A1* | 3/2006 | Yamada | C23C 16/54 118/728 |
| 2006/0124151 A1* | 6/2006 | Yamasaki | C23C 16/4405 134/1.1 |
| 2007/0039942 A1* | 2/2007 | Leung | C23C 16/4586 219/443.1 |
| 2008/0072821 A1 | 3/2008 | Dalton et al. | |
| 2008/0101780 A1 | 5/2008 | Yokouchi et al. | |
| 2008/0142497 A1 | 6/2008 | Sorabji et al. | |
| 2010/0032096 A1* | 2/2010 | Yu | H01L 21/67103 156/345.52 |
| 2011/0092075 A1* | 4/2011 | Suzuki | C23C 16/4584 438/758 |
| 2011/0308551 A1 | 12/2011 | Chung et al. | |
| 2012/0317993 A1 | 12/2012 | McRay | |

FOREIGN PATENT DOCUMENTS

| | | |
|---|---|---|
| JP | 2000-21801 A | 1/2000 |
| JP | 2002313730 A | 10/2002 |
| JP | 2005123284 A | 5/2005 |
| JP | 2009253242 A | 10/2009 |
| JP | 2011009500 A | 1/2011 |

OTHER PUBLICATIONS

PCT Notification of Transmittal of the International Search Report and the Written Opinion of the International Searching Authority for International Application No. PCT/US2014/014768 dated Dec. 29, 2014; 11 total pages.

Japanese Office Action for Application No. 2016-500202 dated Jan. 9, 2018.

Taiwan Office Action for Application No. 103104277 dated Sep. 19, 2017.

Japanese Office Action for Application No. 2016-500202 dated Nov. 29, 2018.

\* cited by examiner

MODULAR SUBSTRATE HEATER FOR EFFICIENT THERMAL CYCLING

CROSS-REFERENCE TO RELATED APPLICATIONS

This application claims benefit of U.S. Provisional Patent Application Ser. No. 61/780,090, filed Mar. 13, 2013, which is hereby incorporated by reference herein.

BACKGROUND

Field

Embodiments of the present invention generally relate to a heater for supporting a substrate in a processing chamber for electronic device fabrication. More specifically, a modular heater that may be utilized in a deposition chamber, an implant chamber, an etch chamber, or an annealing chamber for electronic device fabrication processes.

Description of the Related Art

In the manufacture of electronic devices, such as semiconductor devices, light emitting diodes, and the like, substrates are subjected to many thermal processes, such as etching, deposition, implant, and annealing. Many of these processes require the substrate to be heated to a desired temperature and that temperature is maintained during the specific process. Substrate heating is typically provided by heating devices that radiate heat toward the substrate, provide heat by conduction that is transferred to the substrate, provide heat by induction that is transferred to the substrate, or some combination thereof. In some thermal processes, the substrate must be rapidly heated to a desired temperature to ensure the initiation of film formation or migration of ions (such as in an implant process). During many of the thermal processes, temperature uniformity is also desired across the surface area of the substrate in order to provide uniform chemical or physical reactions on the substrate.

However, many conventional substrate heating schemes have slow heating ramp times as well as poor capability to provide sufficient temperature uniformity across the substrate. This results in longer processing times, and may also result in incomplete processing, which severely affects device yield and throughput. Further, many conventional chambers and associated heating devices are not configured for use in a manner that enables adaptation of different heating regimes without significant rework and downtime.

Therefore, there is a need for apparatus and methods for an improved substrate heater that enables uniform heating of a substrate.

SUMMARY

Embodiments described herein relate to a modular substrate support that may be utilized in a variety of chambers and/or a variety of electronic device fabrication processes. In one embodiment, a substrate support for a substrate processing chamber is provided. The substrate support includes a body having a top plate with a substrate receiving surface, and a movable heater disposed in the body, the heater being movable relative to the top plate.

In another embodiment, a substrate support for a substrate processing chamber is provided. The substrate support comprises a body having a substrate support surface and a first enclosure, and a heater disposed in the first enclosure, the heater containing a second enclosure that is in fluid communication with the first enclosure.

In another embodiment, a process chamber is provided. The process chamber includes a housing containing a processing volume, and a substrate support disposed in the processing volume. The substrate support includes a body having a substrate support surface and a first enclosure, and a heater disposed in the first enclosure, wherein a distance between the heater and the substrate support surface is adjustable.

In another embodiment, a method for processing a substrate is provided. The method includes transferring a substrate to a substrate receiving surface of a substrate support having a heater disposed in a body thereof, detecting the temperature of the substrate, and moving the heater relative to the body and the substrate in response to the detected temperature.

In yet another embodiment, a substrate support for a substrate processing chamber is provided that includes a plurality of heat sources disposed in a body. The body includes a top plate with a substrate receiving surface. The plurality of heat sources disposed in the body are configured to emit light to heat the top plate, wherein a portion of the plurality of heat sources are configured to independently control the light emitted by at least a first heat source relative to a second heat source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
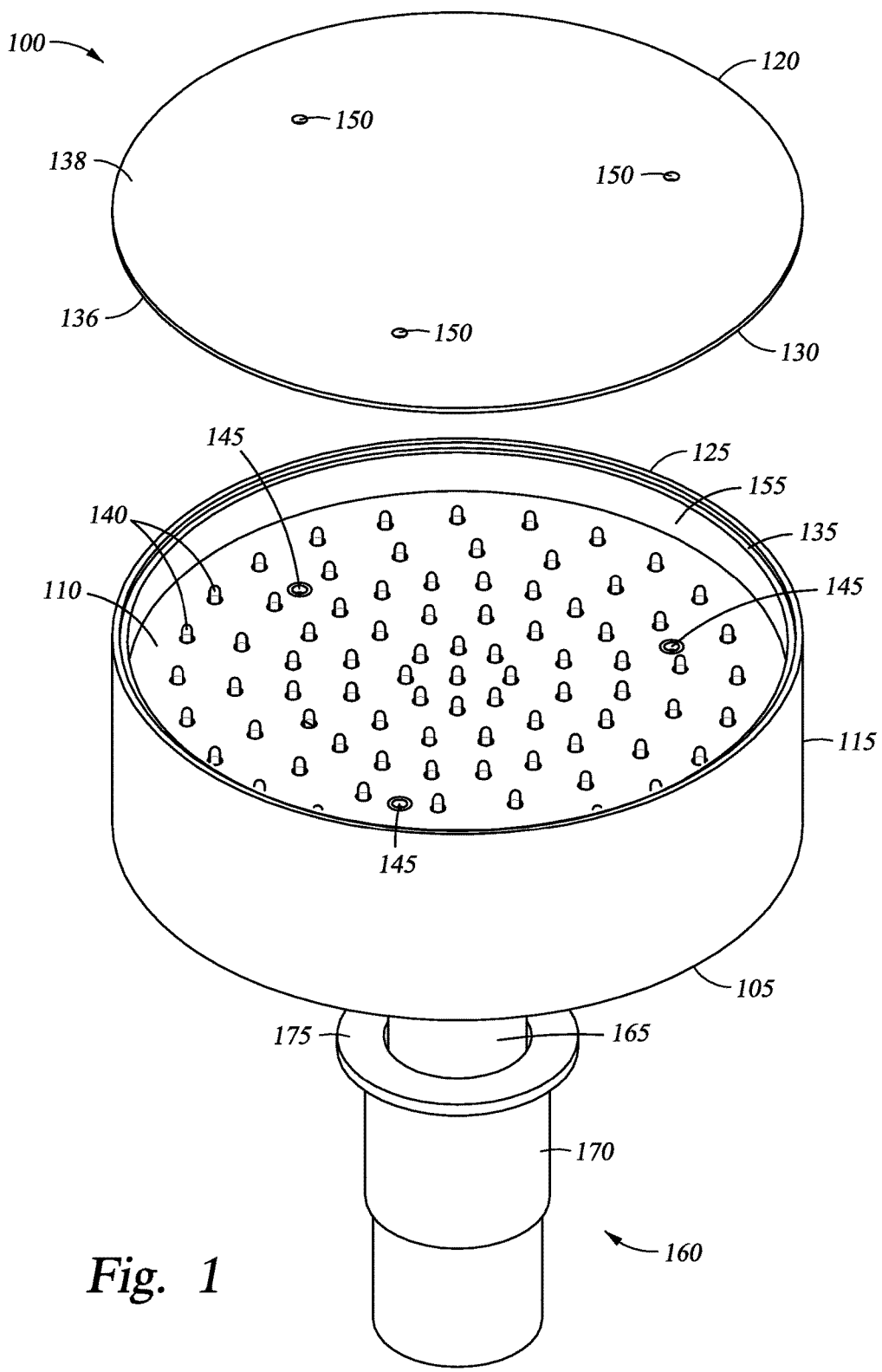
FIG. 1 is a partially exploded isometric view of a substrate support according to embodiments described herein.

To facilitate understanding, identical reference numerals have been used, wherever possible, to designate identical elements that are common to the figures. It is also contemplated that elements disclosed in one embodiment may be beneficially utilized on other embodiments without specific recitation.

DETAILED DESCRIPTION

Embodiments described herein relate to an apparatus and method for a substrate support that is modular in design, enabling use in multiple electronic device fabrication processes. The substrate support as described herein may be utilized in a variety of processing chambers involving different fabrication processes. For example, the substrate support as described herein may be used in deposition chambers, etch chambers, annealing chambers, implant chambers, chambers for light emitting diode formation, as well as other process chambers. The substrate support may be utilized in process chambers available from Applied Materials, Inc. of Santa Clara, Calif., and may also be utilized in process chambers from other manufacturers as well. In one embodiment, the substrate support utilizes a heater that is disposed in a body of the substrate support. The heater may comprise a lamp array and may be coupled to a controller and temperature sensors that enable closed loop control of the temperature of a substrate positioned thereon. The heater may also be vertically and/or rotationally movable relative to the substrate to vary spacing between the substrate and otherwise reduce temperature gradients therein. The substrate support described herein enables faster ramp time and increases temperature uniformity, which increases throughput and decreases cost of ownership.

FIG. 1 is a partially exploded isometric view of a substrate support 100 according to embodiments described herein. The substrate support 100 is modular in that the design enables use in different chambers and/or different processes. In one aspect, components of the substrate support 100 are interchangeable, which enables retrofit into multiple chambers configured for different deposition or thermal processes. The substrate support 100 includes a body 105 having a heater 110 disposed therein that is bounded by an exterior sidewall 115 of the body 105. The heater 110 may comprise a platform that may be movable within a hollow portion of the body 105. A top plate 120 is adapted to be supported by the exterior sidewall 115 about the heater 110. The top plate 120 is shown spaced away from an end 125 of the exterior sidewall 115 to more clearly show the heater 110.

One or both of the end 125 of the exterior sidewall 115 and a peripheral surface 130 of the top plate 120 may include an interface structure to assist in seating the top plate 120 on the exterior sidewall 115 in a predetermined position. The top plate 120 may be fixed to the end 125 of the exterior sidewall 115 by fasteners (not shown) such as screws, clamps, or combinations thereof, which enable easy removal and attachment thereof. The top plate 120 is configured to be modular and can be changed easily during chamber maintenance and for refurbishment. One embodiment of an interface structure is shown as a shoulder 135 disposed on the end 125 of the exterior sidewall 115. The shoulder 135 may be a channel, a groove, a tapered surface or a chamfer. The peripheral surface 130 of the top plate 120 may also include a channel, a groove, a tapered surface or a chamfer that mates with the shoulder 135. The top plate 120 includes a bottom surface 136 and a substrate receiving surface 138 opposite the bottom surface 136. The substrate receiving surface 138 is sized to receive and support a substrate (not shown) during processing, such as substrates having a 200 millimeter (mm) diameter, a 300 mm diameter, a 450 mm diameter, or other diameter. Additionally, the substrate receiving surface 138 may be used to support rectangular or polygonal substrates. The body 105 and the top plate 120 may be disk-shaped as shown in FIG. 1, or the body 105 and the top plate 120 may be rectangular.

The heater 110 includes a plurality of lamp modules 140 adapted to emit electromagnetic energy towards the bottom surface 136 of the top plate 120 in order to heat a substrate (not shown) that is disposed on the substrate receiving surface 138 during processing. The heater 110 also includes lift pin holes 145 for receiving a movable lift pin (not shown) that facilitates substrate transfer to and from the substrate receiving surface 138. Likewise, the top plate 120 includes openings 150 that are coaxially aligned with the lift pin holes 145 when the top plate 120 is installed on the body 105. The heater 110 is sized slightly smaller than an inside dimension of an inner surface 155 of the exterior sidewall 115 to allow movement of the heater 110 relative to the inner surface 155 without any contact therebetween. The substrate support 100 is coupled to a stem assembly 160 that is adapted to interface with a chamber (not shown). Alternatively, the heater 110 may be supported from a sidewall of a chamber in a cantilevered arrangement. The stem assembly 160 includes a telescoping shaft assembly 165 that is utilized to move the heater 110 and the body 105 independently. The stem assembly 160 is disposed in a vacuum seal 170 that may couple with the chamber at a flange 175.

Figure 2:
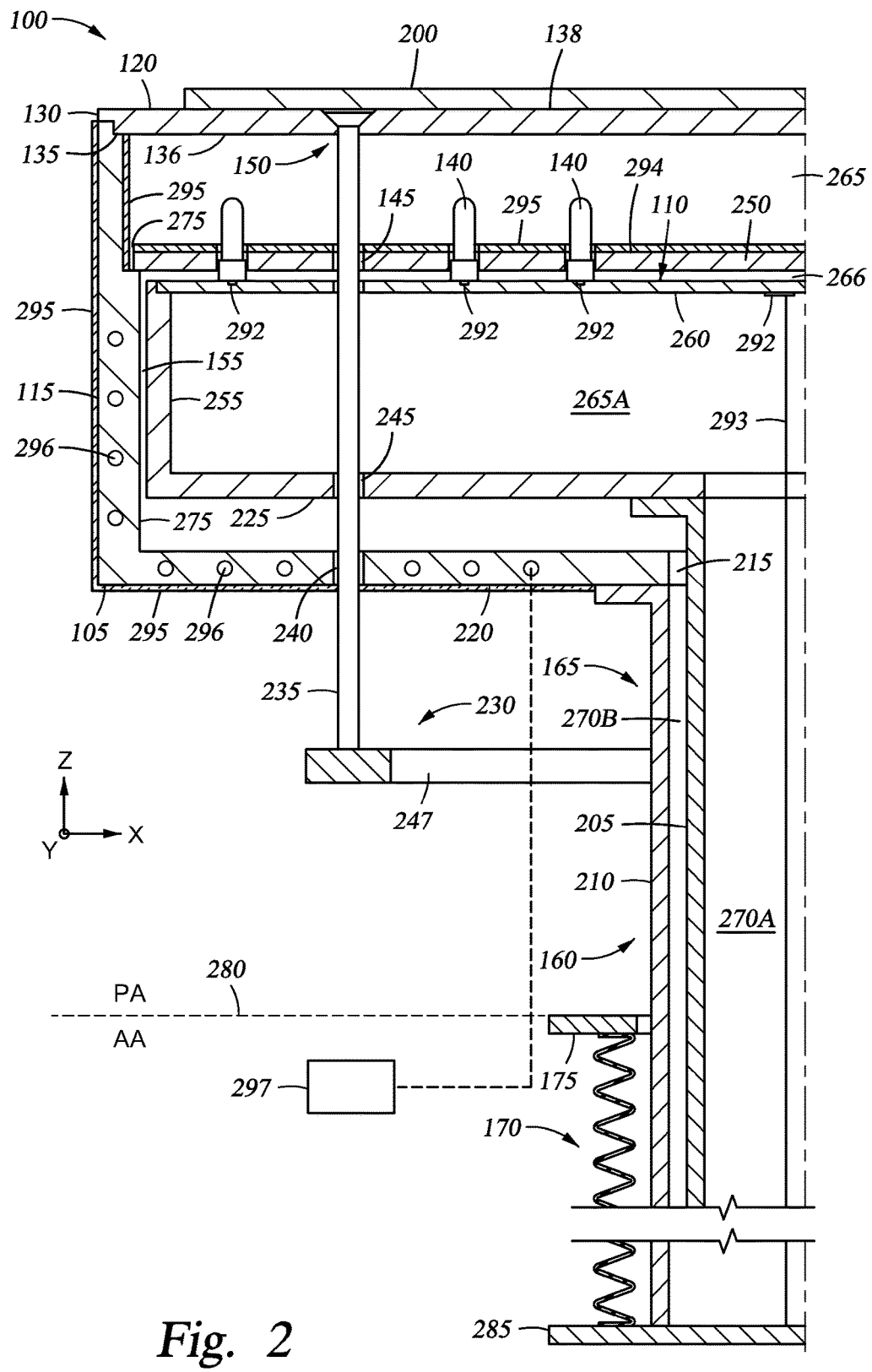
FIG. 2 is a partial side cross sectional view of one embodiment of the substrate heater shown in FIG. 1.

FIG. 2 is a partial side cross sectional view of one embodiment of the substrate support 100 shown in FIG. 1. A substrate 200 is disposed on the substrate receiving surface 138 of the top plate 120. The telescoping shaft assembly 165 of the stem assembly 160 includes a first shaft 205 at least partially disposed within a second shaft 210. The first shaft 205 extends through an opening 215 formed in a bottom 220 of the body 105 so that the first shaft 205 may be coupled to a bottom 225 of the heater 110. The second shaft 210 at least partially surrounds the first shaft 205 and is coupled to the bottom 220 of the body 105.

A lift pin actuator assembly 230 may be coupled with the substrate support 100 to lift and lower lift pins 235 (only one is shown in FIG. 2) that are disposed through openings 240 (only one is shown in FIG. 2) formed in the bottom 220 of the body 105, and openings 245 formed in the bottom 225 of the heater 110. One embodiment of the lift pin actuator assembly 230 includes a lift plate 247 that is coupled with an actuator (not shown) that moves the lift plate 247 vertically (Z direction), which displaces the lift pins 235 to space the substrate 200 away from the substrate receiving surface 138 of the top plate 120 to enable a robotic transfer process.

The heater 110 includes a perforated plate 250 disposed on an interior sidewall 255. A lamp mounting board 260 is disposed on the interior sidewall 255, adjacent the perforated plate 250. Interior surfaces of the bottom 225, the interior sidewall 255 and the lamp mounting board 260 define a first enclosure 265A that is in fluid communication with an interior volume 270A of the first shaft 205. A variable gap 266 is present between the perforated plate 250 and the lamp mounting board 260 as shown in FIG. 2. The volume between the bottom surface 136 of the top plate 120 and an upper surface of the perforated plate 250 defines a second enclosure 265B that is in fluid communication with an interior volume 270B of the second shaft 210. In one embodiment, each of the enclosures 265A, 265B, as well as the variable gap 266 and the interior volumes 270A, 270B, share the same pressure environment. A gap 275 between an outer surface of the perforated plate 250 and the interior sidewall 255, and in interior surface of the exterior sidewall 115, allows fluid communication between the second enclosure 265B and the interior volume 270B of the second shaft 210 through the opening 215.

When the substrate support 100 is installed into a substrate processing chamber (as discussed in more detail in FIG. 4), the flange 175 of the vacuum seal 170 is sealingly coupled to a chamber wall, which is shown as a chamber boundary 280 in FIG. 2. Coupling of the flange 175 of the vacuum seal 170 separates a processing atmosphere PA above the chamber boundary 280, which may be periodically at vacuum pressures, from ambient atmosphere AA below the chamber boundary 280. The vacuum seal 170 may be a bellows structure that allows movement of the telescoping shaft assembly 165, which is also within the processing atmosphere PA and separated from ambient atmosphere AA. The vacuum seal 170 may be coupled to a seal 285 at a distal end thereof that prevents any fluid communication between the ambient atmosphere AA and the processing atmosphere PA. Thus, pressure within the enclosed regions of the substrate support 100 may be substantially equal to the pressure of the processing atmosphere PA during processing, which is typically at a negative pressure (i.e., vacuum pressure). This provides better control over thermal conductive path and better control since the distances can be varied as needed to obtain desired temperature control.

The materials for the structural members of the substrate support 100 include materials that are resistant to heat and chemistry, such as aluminum (Al), ceramics, quartz, stainless steel, as well as engineered polymers, such as polymide-based plastics, a polyetheretherketone (PEEK) material, a polyaryletherketone (PAEK) material, and the like. The stem assembly 160 and the body 105 may comprise aluminum, stainless steel, or ceramics. In some embodiments, the exterior sidewall 115 and the bottom 220 of the body 105 may comprise aluminum, stainless steel, ceramics, and combinations thereof. A coating 295 may be disposed on one or both of the exterior sidewall 115 and the bottom 220 of the body 105. The coating 295 may be a thermal barrier film utilized to retain thermal energy within the body 105. The coating 295 may comprise a silicon film, a ceramic film, an oxide film, or combinations thereof. The coating 295 may also comprise layers of silicon, such as amorphous silicon, monocrystalline silicon, polycrystalline silicon, and combinations thereof. The coating 295 may also comprise nitride layers, such as silicon nitride, oxide layers, such as silicon oxide, buried oxide layers, and the like, as well as stacked layers, such as dielectric stacks and silicon on insulator (SOI) films. The coating 295 may also comprise a plasma resistant material, for example yttrium containing materials, such as yttrium oxide ($Y_2O_3$), elemental yttrium (Y), and combinations thereof.

Portions of the heater 110 may comprise multiple materials, such as stainless steel, aluminum, ceramics, and engineered polymers. For example, the bottom 225 and the interior sidewall 255 of the heater 110 may comprise aluminum or ceramic materials. The lamp mounting board 260 may comprise a heat resistant and electrically insulating material in the form of a circuit board having terminals 292 for the lamp modules 140 as well as for power leads 293 for providing power to the lamp modules 140. The lamp mounting board 260 may comprise VESPEL®, PEEK, PAEK, or other material that may withstand temperatures greater than about 200 degrees Celsius (° C.) to about 250° C., or greater.

The top plate 120 may comprise different materials for utilization with different processes, as well as combinations of various materials dependent on the thermal uniformity desired on the substrate 200. The top plate 120 may comprise aluminum (Al), gallium nitride (GaN), silicon carbide (SiC), as well as other ceramic materials and/or coatings based on thermal requirements of the top plate 120 and/or the thermal process performed using the substrate support 100. For example, the top plate 120 may comprise aluminum for low temperature processes or a ceramic for high temperature processes. The material, surface finishing and/or coatings of the top plate 120 may also be chosen based on a desired emissivity in order to control absorption of thermal energy and thus the temperature of the substrate. For example, an aluminum material may be utilized for the top plate 120 when a low emissivity (high reflectivity) is desired to control absorption of thermal energy. Conversely, when more thermal absorption is desired, a ceramic material may be used. Graphite or glassy carbon may be coated onto the bottom surface 136 of the top plate 120 to increase the emissivity value. Additionally, the top plate 120 may comprise a quartz material (opaque or transparent) depending on the amount of transmittance desired between the lamp modules 140 and the substrate 200. In addition, silicon may be used for the material of the top plate 120. Since the top plate 120 is a modular and interchangeable component of assembly, alternative materials could be utilized for the top plate 120, for example, the top plate 120 may be fabricated from Al, SiC, GaN, graphite, ceramic and other suitable materials or coatings based on thermal and structural needs of chamber.

The perforated plate 250 may comprise an aluminum material, stainless steel or a ceramic material. The perforated plate 250 may include a surface 294 that is reflective. The surface 294 may be polished or optionally include a reflective coating 295. The reflective coating 295 may also be formed on an inner surface 155 of the exterior sidewall 115 to promote reflection of energy from the lamp modules 140 and/or reduce emissivity of the inner surface 155 of the exterior sidewall 115. The reflective coating 295 may comprise gold (Au), silver (Ag), titanium (Ti), tantalum (Ta), or derivatives thereof, such as titania-silica or tantala-silica. In one embodiment, the reflective coating 295 comprises one or more silicon dioxide layers and/or tantalum pentoxide layers. In a specific embodiment, the outermost layer of the reflective coating 295 comprises silicon dioxide.

In one embodiment, one or both of the exterior sidewall 115 and the bottom 220 of the body 105 may include thermal control channels 296 formed therein. The thermal control channels 296 are coupled to a coolant source 297, such as a gas or liquid that enables cooling of the body 105. Fluids from the coolant source 297 may be flowed through the thermal control channels 296 to control the temperature of the body 105. In one example (not shown), an inlet conduit and an outlet conduit (shown in dashed lines) between two or more of the thermal control channels 296 and the coolant source 297 may be routed within the first shaft 205. A slot may be formed through a portion of the sidewall of the first shaft 205 adjacent the opening 215. The slot may be formed to have a length in the Z direction to provide unrestricted movement of the first shaft 205 relative to the second shaft 210.

The lamp modules 140 may be radiation-type lamps, induction type lamps, and combinations thereof. Each of the lamp modules 140 may be light sources that emit light in infrared wavelengths, ultraviolet wavelengths, visible wavelengths, or combinations thereof. In one embodiment, the lamp modules 140 may comprise halogen lamps. The number of lamp modules 140 may also be determined based on user preferences and the thermal process to be performed. The lamp modules 140 may be distributed in a pattern on the lamp mounting board 260, such as a polar array, a grid pattern, concentric rings or substantially linear rows along radial positions of the lamp mounting board 260 (i.e., an azimuth pattern), or other patterns. The lamp modules 140 may be individually controlled or plural lamp modules 140 may be mutually controlled to provide different zones. For example, individual lamp modules 140 or groups of the lamp modules 140 may be independently controlled to provide more or less thermal energy to the substrate 200. In one example, the center of the substrate 200 may be heated to a desired temperature but the periphery of the substrate 200 may be cooler due to thermal losses (via conduction and/or radiation) at the edge of the substrate 200. In this example, rows, rings or groups of lamp modules 140 adjacent the periphery of the lamp mounting board 260 may be provided with a higher input power as compared to rows, rings or groups of lamp modules 140 near a center of the lamp mounting board 260 to provide more heat to the periphery of the substrate 200. The lamp modules 140 may be coupled to a driving circuit that is part of closed-loop temperature control circuit. Temperature sensors may be utilized to provide a metric of temperature of the substrate 200 and the power input to the lamp modules 140 may be controlled based on the temperature data provided by the temperature sensors.

In operation, the thermal energy from the lamp modules 140 may be closely controlled in order to uniformly heat the substrate 200. In addition to the individual or collective control of the lamp modules 140 and the closed-loop temperature control circuit, the distance between the lamp modules 140 and the bottom surface 136 of the top plate 120 may be controlled.

Figure 3A:
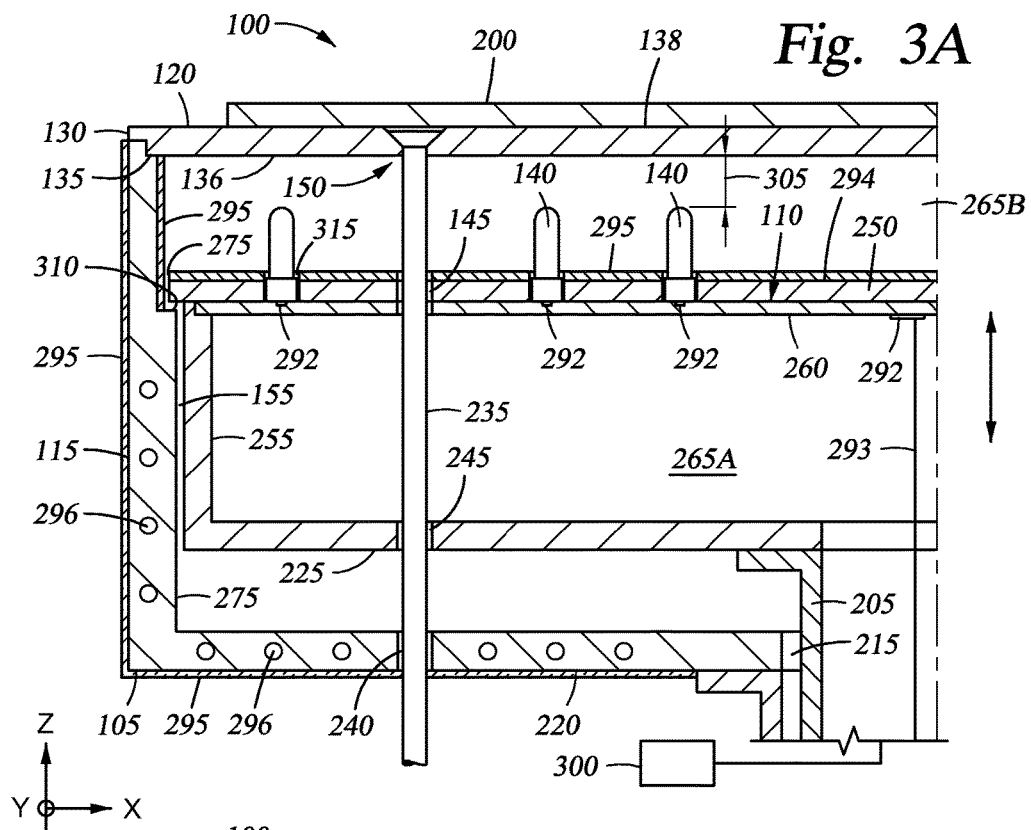
FIGS. 3A and 3B are side cross-sectional views of a portion of the substrate heater shown in FIG. 2.
Figure 3B:
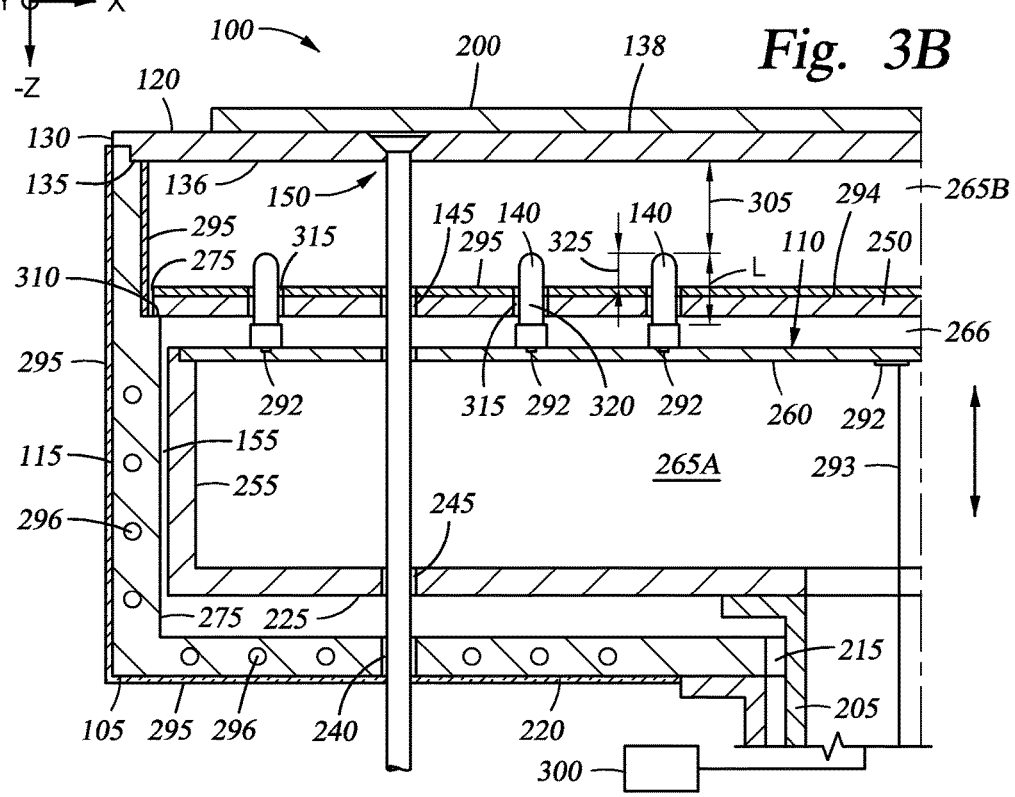

FIGS. 3A and 3B are side cross-sectional views of a portion of the substrate support 100 shown in FIG. 2 showing various embodiments of thermal control aspects provided by the elevation of the heater 110 relative to other portions of the body 105 of the substrate support 100. The heater 110 may be movable within the body 105 to space the lamp modules 140 closer or farther from the bottom surface 136 of the top plate 120. As the heater 110 is coupled to the first shaft 205, the first shaft 205 may be coupled to an actuator 300 that moves the heater 110 vertically within the body 105 to provide a controlled spacing distance 305 between the lamp modules 140 and the bottom surface 136 of the top plate 120. In some embodiments, the heater 110 may be raised to a position where the perforated plate 250 is contacted by the lamp mounting board 260 in a manner that lifts the perforated plate 250 from a shoulder region 310 formed in the inner surface 155 of the exterior sidewall 115.

As shown in FIG. 3A, the first shaft 205 is actuated vertically upward (+Z direction) to cause the lamp modules 140 to move toward the bottom surface 136 of the top plate 120. This brings the lamp modules 140 closer to the bottom surface 136 of the top plate 120 and thermal energy from the lamp modules 140 may be more focused to specific regions of the substrate 200. The shorter spacing distance 305 shown in FIG. 3A may be utilized to apply more heat to the substrate 200 disposed on the substrate receiving surface 138 of the top plate 120 since the lamp modules 140 are closer to the top plate 120, and may also provide rapid heating of the substrate 200.

As shown in FIG. 3B, the first shaft 205 may be actuated downward (−Z direction) to lengthen the spacing distance 305 between the lamp modules 140 and the bottom surface 136 of the top plate 120. To provide the spacing distance 305 shown in FIG. 3B, the heater 110 may move vertically downward to a position where the perforated plate 250 is supported by the shoulder region 310 and no longer moves with the heater 110. The longer spacing distance 305 shown in FIG. 3B may be utilized when less thermal energy from the lamp modules 140 is required. Further, each of the lamp modules 140 include a housing 320 that at least partially extends through openings 315 formed in the perforated plate 250, and the position of the lamp modules 140 in the openings 315 formed in the perforated plate 250 may be controlled. For example, the housings 320 may include an overall length L, and an exposed portion 325 of the housing 320 may be adjusted based on the position of the heater 110 relative to the position of the perforated plate 250. This may be utilized to control the intensity of the lamp modules 140 by limiting the amount of thermal energy that is emitted from the housings 320 of the lamp modules 140 into the second enclosure 265B of the substrate support 100.

Thus, the substrate support 100 as described herein provides rapid and controlled heating of a substrate. The substrate support 100 is also modular as various heating regimes may be performed which enables utilization in multiple processes. The substrate support 100 contains a heater 110 comprising a plurality of lamp modules 140 that may be controlled individually or in groups to provide efficient heating of the substrate. The heater 110 may be movable within the substrate support 100 to vary a spacing between a top plate 120 and the lamp modules 140. The number, the type, or the pattern of lamp modules 140 may be chosen based on process requirements, which provides a modular aspect. In one aspect, one specific lamp mounting board 260 for a process may be replaced with another lamp mounting board 260 for another process with little downtime. For example, the lamp mounting board 260 may be replaced by removing the top plate 120 and the perforated plate 250, and disconnecting power leads 293. A different lamp mounting board for another process may be installed by pairing the lamp mounting board with an appropriate perforated plate, connecting the power leads of the lamp mounting board, and reinstalling the top plate 120. Thus, a user may interchange multiple lamp mounting boards 260 with varying numbers, patterns or types of lamp modules 140 and each of the different lamp mounting boards 260 may be paired with a corresponding perforated plate 250 for use in a chamber for a specific thermal process. Additionally, the top plate 120 may be replaced based on material having the desired emissivity necessary to heat the substrate to a desired temperature.

Figure 4:
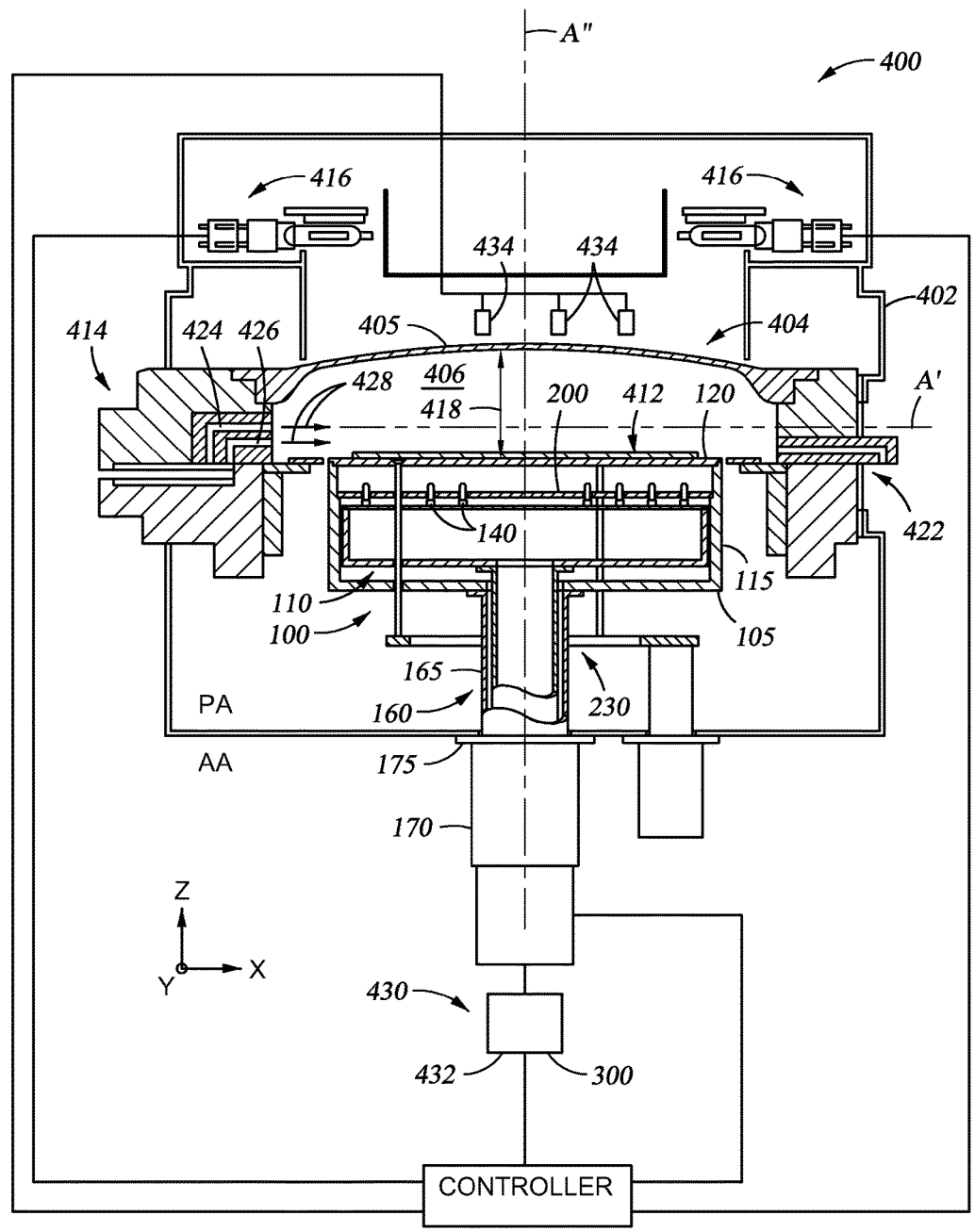
FIG. 4 is a schematic side cross-sectional view of a chamber that may be utilized with the substrate heater according to embodiments described herein.

FIG. 4 is a schematic side cross-sectional view of a substrate processing chamber 400 that may be utilized with the substrate support 100 according to embodiments described herein. The substrate processing chamber 400 may be utilized for depositing materials on a substrate, such as epitaxial deposition, although the substrate support 100 may be used in other substrate processing chambers configured for etching, sputtering, or other deposition and thermal processes. The substrate processing chamber 400 shown in FIG. 4 may be utilized in a CENTURA® integrated processing system available from Applied Materials, Inc., of Santa Clara, Calif. The substrate support 100 may also be used in substrate processing chambers and/or systems developed by, or available from, other manufacturers.

The substrate processing chamber 400 includes housing structure 402 made of a process resistant material, such as aluminum or stainless steel. The housing structure 402 encloses various functioning elements of the substrate processing chamber 400, such as a quartz chamber 404, which partially bounds a processing volume 406. The quartz chamber 404 includes a ceiling 405 that is a side of the quartz chamber 404. The ceiling 405 may be a quartz dome that is substantially transparent to optical energy. The substrate support 100 is utilized to receive a substrate 200 within the processing volume 406 through a transfer port (not shown) formed through the housing structure 402. Reactive species from precursor reactant materials are applied to a surface 412 of the substrate 200 from a gas distribution assembly 414. Heating of the substrate 200 and/or the processing volume 406 may be provided by heat sources, such as external lamp modules 416 disposed on the chamber 400 and lamp modules 140 within the substrate support 100. In one embodiment, the external lamp modules 416 are infrared lamps. Radiation from the lamp modules 416 travels through the ceiling 405 of the quartz chamber 404 to heat the substrate 200. The ceiling 405 may be a quartz window that is transparent to wavelengths emitted from the external lamp modules 416.

Reactive species are provided to the processing volume 406 by the gas distribution assembly 414, and processing byproducts are removed from the processing volume 406 by an exhaust assembly 422, which is typically in communication with a vacuum source (not shown). Precursor reactant materials, as well as diluents, purge and vent gases for the substrate processing chamber 400, enter through the gas distribution assembly 414 and exit through the exhaust assembly 422.

In one embodiment, one or more gases are provided to the processing volume 406 from a first gas inlet 424 and a second gas inlet 426. In some embodiments, the first gas inlet 424 and the second gas inlet 426 are configured for a laminar flow path 428A or a jetted flow path 428B. Each of the flow paths 428A, 428B are configured to flow across an axis A' toward the exhaust assembly 422. The axis A' is substantially normal to a longitudinal axis A" of the substrate processing chamber 400.

The body 105 of the substrate support 100 is movable relative to the axis A' and/or the longitudinal axis A" utilizing an actuator assembly 430. Likewise, the heater 110 is movable relative to the longitudinal axis A". The actuator assembly 430 is coupled to the stem assembly 160. The actuator assembly 430 may include the actuator 300 (that is coupled to the first shaft 205 (shown in FIGS. 2, 3A and 3B)), which may be a first actuator, as well as a second actuator 432 (that is coupled to the second shaft 210 (shown in FIGS. 2, 3A and 3B)). The vacuum seal 170 may be a bellows device, rolling diaphragm, or equivalent sealing device that contains negative pressure within the interior of the quartz chamber 404 and provides isolation between ambient atmosphere AA and the processing atmosphere PA.

In operation, the substrate 200 is heated by heat sources, such as by one or both of the lamp modules 140 and the external lamp modules 416. In one aspect, at least a portion of the energy from the lamp modules 416 may be utilized to preheat precursor gases, dissociate precursor gases, and/or maintain dissociation temperatures of precursor gases while the energy from the lamp modules 140 are utilized to heat the substrate 200. The temperature of the substrate 200 may be monitored by one or more temperature sensors 434. The temperature information is provided to the controller and the input power to each of the heat sources are adjusted to maintain a desired temperature. Additionally, the body 105 of the heater 110 may be moved vertically (Z direction) within the processing volume 406 to adjust a spacing distance 418 between the substrate 200 and the ceiling 405. Adjusting the spacing distance 418 allows the substrate 200 to be positioned closer to the external lamp modules 416 for greater heat intensity from the external lamp modules 416, which may utilized to rapidly heat the substrate 200. Conversely, lowering the body 105 of the heater 110 relative to the ceiling 405 will provide less intense heating of the substrate 200.

Thus, a substrate support 100 is provided herein may be utilized in a variety of processing chambers involving different fabrication processes. The substrate support 100 is modular and provides multiple variables to control the heating of the substrate 200. The substrate support 100 includes a top plate 120 that may be changed based on process requirements. Additionally, the substrate support 100 enables variability in multiple processes utilizing a closed-loop temperature control circuit. The power to one of both of the external lamp modules 416 and the lamp modules 140 may be controlled individually or in groups to provide heating of the substrate 200. The heating provided by the lamp modules 140 may also be controlled individually or within groups to provide different thermal energy in specific zones. Additionally, as described in FIGS. 3A and 3B, the heater 110 may be moved vertically (Z direction) within the body 105 to adjust a spacing between the lamp modules 140 and the substrate 200 to vary the amount of thermal energy to the substrate. The exposed surface area of the housings 320 of the lamp modules 140 may be varied which provides another thermal control aspect of the substrate support 100. Finally, the spacing distance 418 between the substrate 200 and the ceiling 405 of the substrate processing chamber 400 may be varied, which provides another thermal control aspect. Thus, the substrate 200 is maintained at a desired temperature due to the closed-loop temperature control circuit, and the substrate 200 may be rapidly heated, if desired.

While the foregoing is directed to embodiments of the present invention, other and further embodiments of the invention may be devised without departing from the basic scope thereof, and the scope thereof is determined by the claims that follow.

The invention claimed is:

1. A substrate support for a substrate processing chamber, comprising:
    a body having a perforated plate opposing a top plate having a substrate receiving surface, wherein the perforated plate has a reflective coating disposed thereon and the top plate includes a first plurality of openings formed therein and the perforated plate has a second plurality of openings formed therein, wherein each of the first and the second plurality of openings are sized to receive a lift pin; and
    a heater disposed in the body, the heater being movable relative to the top plate, wherein the heater is coupled to a stem assembly comprising a first shaft coupled to a bottom of the body and a second shaft that is disposed in the first shaft, and wherein the second shaft is coupled to the heater and is linearly movable relative to the first shaft, and the first shaft is linearly movable relative to the second shaft.

2. The substrate support of claim 1, wherein the body contains a first enclosure and the movable heater contains a second enclosure that is in fluid communication with the first enclosure.

3. The substrate support of claim 1, wherein the heater comprises a plurality of lamp modules.

4. The substrate support of claim 3, wherein the perforated plate includes a plurality of apertures aligned with the lamp modules.

5. The substrate support of claim 4, wherein the plurality of lamp modules are movable relative to the perforated plate.

6. The substrate support of claim 5, wherein the perforated plate is movable relative to the substrate receiving surface.

7. The substrate support of claim 6, wherein each of the lamp modules comprises a housing having a length, and the length of the housing extending through each of the apertures in the perforated plate is adjustable.

8. The substrate support of claim 4, wherein each of the lamp modules comprises a housing having a length, and the length of the housing extending through each of the apertures in the perforated plate is adjustable.

9. The substrate support of claim 3, wherein the lamp modules are grouped into a plurality of zones, and each zone is individually controlled.

10. The substrate support of claim 1, wherein the body comprises a plurality of thermal control channels formed therein.

11. A substrate support for a substrate processing chamber, comprising:
- a body having a substrate support surface and a first enclosure disposed below the substrate support surface, wherein the substrate support surface includes a first plurality of openings formed therein; and
- a heater disposed in the first enclosure, the heater containing a second enclosure that is in fluid communication with the first enclosure and being movable relative to the substrate support surface, wherein the heater is coupled to a stem assembly comprising a first shaft coupled to a bottom of the body and a second shaft that is disposed in the first shaft, and wherein the second shaft is coupled to the heater and is linearly movable relative to the first shaft, and the first shaft is linearly movable relative to the second shaft, wherein the heater is received inside an inner surface of the first enclosure and is movable within the inner surface by the second shaft without any contact between the inner surface and the heater, and wherein the bottom includes a plurality of thermal control channels formed therein and a plurality of second openings formed therein that align with the first plurality of openings, each of the first and the second plurality of openings being sized to receive a lift pin.

12. The substrate support of claim 11, wherein the heater comprises a plurality of lamp modules.

13. The substrate support of claim 12, further comprising a perforated plate having a plurality of apertures aligned with the lamp modules.

14. The substrate support of claim 13, wherein the plurality of lamp modules are movable relative to the perforated plate.

15. A substrate support for a substrate processing chamber, comprising:
- a body having a top plate with a substrate receiving surface and a bottom plate opposing the top plate, the top plate having a first plurality of openings formed therein, and the bottom plate having a second plurality of openings formed therein;
- a plurality of lamp modules positioned on a mounting board disposed in the body between the top plate and the bottom plate, the mounting board having a third plurality of openings formed therein that align with the first plurality of openings and the second plurality of openings, wherein each of the first, the second, and the third plurality of openings are sized to receive a lift pin; and
- a perforated plate disposed between the top plate and the plurality of lamp modules, the perforated plate having a plurality of apertures aligned with the lamp modules, wherein the mounting board and the plurality of lamp modules are linearly movable relative to the perforated plate.

16. The substrate support of claim 15, wherein the body comprises a plurality of thermal control channels formed therein.

17. A substrate support for a substrate processing chamber, comprising:
- a body having a top plate with a substrate receiving surface, the body comprising a perforated plate coupled to a sidewall defining an enclosure with the top plate and a bottom plate opposing the top plate;
- a plurality of thermal control channels formed in the body;
- a stem comprising a first shaft coupled to a bottom of the body and a second shaft that is linearly movable relative to the first shaft; and
- a heater disposed within the enclosure that is coupled to the second shaft, the heater comprising a plurality of lamp modules positioned on a mounting board between the top plate and the bottom plate, each of the plurality of lamp modules being linearly movable relative to the substrate receiving surface and the perforated plate by the second shaft and configured to emit light to heat the top plate, wherein a portion of the plurality of heat sources are coupled to a controller configured to independently control the light emitted by at least a first heat source relative to a second heat source, and wherein the mounting board is sized to fit inside an inside dimension of an inner surface of the enclosure to allow movement of the mounting board relative to the inner surface without any contact therebetween.

18. The substrate support of claim 17, wherein the plurality of heat sources are movable relative to the top plate.

* * * * *